(12) United States Patent
Imeson et al.

(10) Patent No.: US 10,263,362 B2
(45) Date of Patent: Apr. 16, 2019

(54) FLUIDICALLY SEALED ENCLOSURE FOR WINDOW ELECTRICAL CONNECTIONS

(71) Applicant: AGC Automotive Americas R&D, Inc., Ypsilanti, MI (US)

(72) Inventors: Christopher A. Imeson, Belle River (CA); William C. Schuch, Adrian, MI (US)

(73) Assignee: AGC Automotive Americas R&D, Inc., Ypsilanti, MI (US)

( * ) Notice: Subject to any disclaimer, the term of this patent is extended or adjusted under 35 U.S.C. 154(b) by 0 days.

(21) Appl. No.: 15/472,970

(22) Filed: Mar. 29, 2017

(65) Prior Publication Data

US 2018/0287294 A1    Oct. 4, 2018

(51) Int. Cl.
| | |
|---|---|
| H01R 13/58 | (2006.01) |
| H05K 5/06 | (2006.01) |
| H05K 5/02 | (2006.01) |
| H01R 13/52 | (2006.01) |
| H01R 4/02 | (2006.01) |
| H01R 13/506 | (2006.01) |
| H01R 12/63 | (2011.01) |
| B60J 10/70 | (2016.01) |

(52) U.S. Cl.
CPC ......... *H01R 13/5845* (2013.01); *H01R 4/023* (2013.01); *H01R 13/506* (2013.01); *H01R 13/5216* (2013.01); *H05K 5/0213* (2013.01); *H05K 5/0247* (2013.01); *H05K 5/064* (2013.01); *B60J 10/70* (2016.02); *H01R 12/63* (2013.01)

(58) Field of Classification Search
CPC ............... H01R 13/5845; H01R 4/023; H01R 13/5216; H05K 5/0213; H05K 5/0247; H05K 5/064
USPC ........................................................ 174/522
See application file for complete search history.

(56) References Cited

U.S. PATENT DOCUMENTS

| | | |
|---|---|---|
| 2,644,066 A | 6/1953 | Glynn |
| 2,709,211 A | 5/1955 | Glynn |
| 3,324,543 A | 6/1967 | Mcvey |
| 3,390,969 A | 7/1968 | Sullivan et al. |
| 3,568,012 A | 3/1971 | Ernst et al. |
| 3,657,802 A | 4/1972 | Lunetiers |
| 3,736,649 A | 6/1973 | Bristow |
| 3,789,192 A | 1/1974 | Spindler |

(Continued)

FOREIGN PATENT DOCUMENTS

| | | |
|---|---|---|
| CA | 2835381 A1 | 11/2012 |
| CN | 102420266 A | 4/2012 |

(Continued)

*Primary Examiner* — Timothy J Thompson
*Assistant Examiner* — Charles Pizzuto
(74) *Attorney, Agent, or Firm* — Quinn IP Law (57) ABSTRACT

According to aspects of the present disclosure, a method of environmentally sealing an electrical joint formed between an electrical connection element and an electrical conductor disposed on a transparent pane is described. The method includes adhering a mechanically protective enclosure to the transparent pane to define an internal volume therebetween and filling at least a portion of the internal volume with a sealing material that inhibits ingress of liquid into the volume and provides a fluidic environmental barrier about the electrical joint. The electrical joint is disposed within the internal volume and spaced from the enclosure.

18 Claims, 4 Drawing Sheets

(56) References Cited

U.S. PATENT DOCUMENTS

| | | | |
|---|---|---|---|
| 3,795,041 A | 3/1974 | Hennicke et al. |
| 3,900,593 A | 8/1975 | Herczog et al. |
| 3,926,357 A | 12/1975 | Matrisian |
| 4,024,613 A | 5/1977 | Martel et al. |
| 4,531,044 A | 7/1985 | Chang |
| 4,546,409 A | 10/1985 | Yoshino et al. |
| 4,589,584 A | 5/1986 | Christiansen et al. |
| 4,707,591 A | 11/1987 | Sprenger |
| 4,763,828 A | 8/1988 | Fukaya et al. |
| 4,769,622 A | 9/1988 | Leavitt |
| 4,782,209 A | 11/1988 | Caers et al. |
| 4,918,288 A | 4/1990 | Carter et al. |
| 4,925,421 A | 5/1990 | van den Broek |
| 4,925,607 A | 5/1990 | Kyle |
| 4,935,583 A | 6/1990 | Kyle |
| 5,013,612 A | 5/1991 | Hunt et al. |
| 5,058,800 A | 10/1991 | Yoshizawa et al. |
| 5,134,248 A | 7/1992 | Kiec et al. |
| 5,198,056 A | 3/1993 | Stockli et al. |
| 5,229,070 A | 7/1993 | Melton et al. |
| 5,229,613 A | 7/1993 | Pandelisev et al. |
| 5,270,517 A | 12/1993 | Finley |
| 5,288,006 A | 2/1994 | Otsuka et al. |
| 5,350,105 A | 9/1994 | Delalle et al. |
| 5,354,392 A | 10/1994 | Santo et al. |
| 5,368,814 A | 11/1994 | Gonya et al. |
| 5,415,944 A | 5/1995 | Kazem-Goudarzi et al. |
| 5,427,865 A | 6/1995 | Mullen, III et al. |
| 5,429,293 A | 7/1995 | Bradley, III et al. |
| 5,454,506 A | 10/1995 | Jordhamo et al. |
| 5,540,379 A | 7/1996 | Kazem-Goudarzi et al. |
| 5,543,601 A | 8/1996 | Bartrug et al. |
| 5,626,483 A | 5/1997 | Naitoh |
| 5,735,446 A | 4/1998 | White et al. |
| 5,738,270 A | 4/1998 | Malmgren |
| 5,738,554 A | 4/1998 | Borger et al. |
| 5,798,031 A | 8/1998 | Charlton et al. |
| 5,837,960 A | 11/1998 | Lewis et al. |
| 5,857,259 A | 1/1999 | Johnston |
| 5,881,944 A | 3/1999 | Edwards et al. |
| 5,986,208 A | 11/1999 | Taylor et al. |
| 5,995,293 A | 11/1999 | Derkits, Jr. et al. |
| 6,039,238 A | 3/2000 | Panaghe |
| 6,039,616 A | 3/2000 | Pereira et al. |
| 6,042,932 A | 3/2000 | Ingles et al. |
| 6,103,034 A | 8/2000 | Fujiwara et al. |
| 6,103,998 A | 8/2000 | Kuno et al. |
| 6,103,999 A | 8/2000 | Nishio et al. |
| 6,123,588 A | 9/2000 | Johnston |
| 6,217,373 B1 | 4/2001 | Johnston |
| 6,229,221 B1 | 5/2001 | Kloen et al. |
| 6,253,986 B1 | 7/2001 | Brofman et al. |
| 6,253,988 B1 | 7/2001 | Pereira |
| 6,307,515 B1* | 10/2001 | Sauer .................. H01Q 1/1271 |
| | | | 343/711 |
| 6,319,461 B1 | 11/2001 | Domi et al. |
| 6,359,540 B1 | 3/2002 | Spiller et al. |
| 6,396,026 B2 | 5/2002 | Gillner et al. |
| 6,428,367 B1 | 8/2002 | Costa |
| 6,534,720 B2 | 3/2003 | Von Alpen et al. |
| 6,774,315 B1 | 8/2004 | Pierson et al. |
| 6,816,385 B1 | 11/2004 | Alcoe |
| 6,834,969 B2 | 12/2004 | Bade et al. |
| 6,861,991 B2 | 3/2005 | Mueller et al. |
| 6,872,465 B2 | 3/2005 | Soga et al. |
| 6,878,246 B2 | 4/2005 | Latvaitis et al. |
| 6,893,799 B2 | 5/2005 | Danovitch et al. |
| 6,902,098 B2 | 6/2005 | Dautartas |
| 7,010,856 B2 | 3/2006 | Suda et al. |
| 7,134,201 B2* | 11/2006 | Ackerman ......... H01R 43/0207 |
| | | | 29/857 |
| 7,223,695 B2 | 5/2007 | Zhong et al. |
| 7,270,548 B2* | 9/2007 | Jenrich .................. H01R 4/023 |
| | | | 439/34 |
| 7,370,982 B2 | 5/2008 | Bauer et al. |
| 7,510,401 B2 | 3/2009 | Humpston et al. |
| 7,708,593 B1* | 5/2010 | Gherardini ......... H01R 13/5216 |
| | | | 439/604 |
| 7,780,058 B2 | 8/2010 | Yao et al. |
| 7,833,070 B2 | 11/2010 | Lyon |
| 7,838,954 B2 | 11/2010 | Buchwalter et al. |
| 7,972,710 B2 | 7/2011 | Pereira |
| 8,077,100 B2 | 12/2011 | Baranski |
| 8,092,621 B2 | 1/2012 | Ho et al. |
| 8,109,782 B2 | 2/2012 | Ziegler et al. |
| 8,157,158 B2 | 4/2012 | Gruber et al. |
| 9,272,371 B2 | 3/2016 | Hoepfner |
| 2001/0030185 A1 | 10/2001 | Schnabel et al. |
| 2002/0004325 A1 | 1/2002 | Pereira et al. |
| 2002/0111081 A1 | 8/2002 | Machado |
| 2003/0121906 A1 | 7/2003 | Abbott et al. |
| 2003/0155467 A1 | 8/2003 | Petrenko |
| 2004/0237302 A1 | 12/2004 | Antaya et al. |
| 2005/0035090 A1* | 2/2005 | Johnson ................ B23K 1/0053 |
| | | | 219/85.13 |
| 2005/0195488 A1 | 9/2005 | McCabe et al. |
| 2005/0221538 A1 | 10/2005 | Suzuki et al. |
| 2005/0269121 A1* | 12/2005 | Ikeda ....................... B60R 11/02 |
| | | | 174/58 |
| 2006/0056003 A1 | 3/2006 | Tonar et al. |
| 2007/0037004 A1 | 2/2007 | Pereira |
| 2007/0045002 A1* | 3/2007 | Jenrich .................. H01R 4/023 |
| | | | 174/520 |
| 2007/0105412 A1 | 5/2007 | Hoepfner et al. |
| 2007/0117475 A1 | 5/2007 | Tu |
| 2007/0224842 A1 | 9/2007 | Hoepfner et al. |
| 2007/0231594 A1 | 10/2007 | Pereira |
| 2008/0175748 A1 | 7/2008 | Pereira |
| 2009/0077797 A1 | 3/2009 | Berghofer et al. |
| 2010/0035072 A1 | 2/2010 | Watanabe et al. |
| 2010/0326983 A1 | 12/2010 | Sitterlet et al. |
| 2011/0220704 A1 | 9/2011 | Liu et al. |
| 2011/0244252 A1 | 10/2011 | Loh |
| 2011/0268985 A1 | 11/2011 | Zhang et al. |
| 2012/0048349 A1* | 3/2012 | Metin ................ H01L 31/02013 |
| | | | 136/251 |
| 2012/0091113 A1 | 4/2012 | Bennett et al. |
| 2012/0117880 A1 | 5/2012 | Lahnala et al. |
| 2012/0273043 A1 | 11/2012 | Lochtefeld et al. |
| 2012/0298416 A1 | 11/2012 | Ziegler et al. |
| 2012/0305311 A1 | 12/2012 | Jenrich |
| 2013/0043066 A1 | 2/2013 | Cholewa et al. |
| 2013/0121874 A1 | 5/2013 | Ueshima et al. |
| 2014/0199115 A1 | 7/2014 | de Avila Ribas et al. |
| 2016/0204522 A1* | 7/2016 | Bennett ..................... H01R 4/02 |
| | | | 219/203 |

FOREIGN PATENT DOCUMENTS

| | | |
|---|---|---|
| DE | 3604437 A1 | 8/1987 |
| DE | 19536131 C1 | 1/1997 |
| DE | 19536181 A1 | 4/1997 |
| EP | 0248030 A1 | 12/1987 |
| EP | 0262699 A1 | 4/1988 |
| EP | 0426303 A2 | 5/1991 |
| EP | 0581610 A1 | 2/1994 |
| EP | 0869531 A2 | 10/1998 |
| EP | 1058349 A1 | 12/2000 |
| EP | 1139697 A2 | 10/2001 |
| EP | 1488972 A1 | 12/2004 |
| EP | 1657964 A1 | 5/2006 |
| EP | 1493207 B1 | 2/2007 |
| FR | 1104595 A | 11/1955 |
| FR | 2893189 A1 | 5/2007 |
| GB | 1228451 A | 4/1971 |
| GB | 2192023 B | 1/1990 |
| JP | S62172676 A | 7/1987 |
| JP | H05329931 A | 12/1993 |
| JP | H1040977 A | 2/1998 |
| JP | 2002134254 A | 5/2002 |
| JP | 2007018981 A | 1/2007 |
| WO | 8703290 | 6/1987 |
| WO | 1998016943 A1 | 4/1998 |

(56) References Cited

FOREIGN PATENT DOCUMENTS

| WO | 1998047200 A1 | 10/1998 |
| WO | 2004068643 A1 | 8/2004 |
| WO | 2006128203 A1 | 12/2006 |
| WO | WO 2011039057 * | 4/2011 |
| WO | WO 2011039057 A1 * | 4/2011 |
| WO | 2015023921 A1 | 2/2015 |

* cited by examiner

FLUIDICALLY SEALED ENCLOSURE FOR WINDOW ELECTRICAL CONNECTIONS

INTRODUCTION

The disclosure relates to the field of window assemblies, and, more specifically, to fluidically sealed enclosures for window electrical connections.

Window assemblies used in, for example, vehicles and buildings can be functionalized to include an electrical conductor disposed on a surface of a transparent pane. The electrical conductor can provide any desirable electrical function such as heating the transparent pane or acting as an antenna. The electrical conductor can be, for example, a printed silver circuit. Power can be transferred from a power source to the electrical conductor through a wiring harness coupled to the electrical conductor. The wiring harness includes an electrical connection element bonded to the electrical conductor. The terminal can be bonded to the electrical conductor using an electrically conductive joint such as a solder joint.

Because of their use in vehicles and buildings, the electrically conductive joint can be exposed to the elements. This exposure produces corrosion, weakening, and failure of the solder joint, which prevents power from being transferred to the electrical conductor through the solder joint. A polymeric encapsulation can be placed over the electrically conductive joint and a portion of the electrical conductor and a portion of the wiring harness and other exposed elements in an effort to protect the solder joint from exposure to the elements. The polymeric encapsulation may be made of a non-conductive material.

One drawback of the polymeric encapsulation includes creating mechanical stresses on the solder joint. For example, differences in coefficients of thermal expansion of the solder joint, the transparent pane, and the polymeric encapsulation create mechanical stress on the assembly. When the transparent pane is a glass pane, the glass pane is prone to cracking. The mechanical stress may also delaminate the electrical conductor from the transparent pane, separate the solder joint from electrical connection with a portion of the electrical conductor, or crack the solder joint.

Another drawback of the polymeric encapsulation includes exposure of the solder joint to the elements. Water routinely penetrates through the polymeric encapsulation to contact the electrical conductor near the solder joint. Water contacting the electrical conductor near the solder joint is slow to evaporate because the water is sheltered by the polymeric encapsulation. As such, the water may corrode the electrical conductor or the solder joint, thereby degrading performance of the electrical conductor or rendering the electrical conductor inoperable.

SUMMARY

It is desirable to provide a window assembly that reduces mechanical stress on the components and electrical joints to avoid the above-discussed drawbacks. It is also desirable to provide a window assembly that reduces ingress of water to the electrical joint. According to systems and method of the present disclosure, a fluidically sealed enclosure is provided to reduce and/or eliminate these drawbacks. The enclosure substantially reduces mechanical stress imparted on the electrical joint, and the fluidic seal provided by the enclosure reduces or eliminates water-catalyzed corrosion of the electrical joint.

According to aspects of the present disclosure, a method of environmentally sealing an electrical joint formed between an electrical connection element and an electrical conductor disposed on a transparent pane is described. The method includes adhering a mechanically protective enclosure to the transparent pane to define an internal volume therebetween and filling at least a portion of the internal volume with a sealing material that inhibits ingress of liquid into the volume and provides a fluidic environmental barrier about the electrical joint. The electrical joint is disposed within the internal volume and spaced from the enclosure.

According to further aspects of the present disclosure, filling includes injecting the sealing material into the internal volume via a fill port extending through the enclosure.

According to further aspects of the present disclosure, the method further includes determining that the filling has been performed by identifying a presence of the sealing material within the fill port.

According to further aspects of the present disclosure, the sealing material, after filling, covers the electrical joint, and the sealing material, after filling, contacts at least one wall of the enclosure.

According to further aspects of the present disclosure, the transparent pane further includes a ceramic coating disposed thereon, and the electrical conductor is adhered to the ceramic coating.

According to further aspects of the present disclosure, the electrical conductor consists essentially of silver.

According to further aspects of the present disclosure, the sealing material is an electrically insulating material.

According to further aspects of the present disclosure, the internal volume includes a second electrical connection element therein, the second electrical connection element being attached to a second wire extending outside the internal volume, and the sealing material, after filling, covers a second electrical joint between the second electrical connection element and a second electrical conductor disposed on the transparent pane.

According to further aspects of the present disclosure, the enclosure is adhered to the transparent pane using structural bonding tape or a pressure-sensitive adhesive.

According to further aspects of the present disclosure, the enclosure includes a first member and a second member, the first member is adhered to the transparent pane, the second member is attached to the first member, and a wiring harness passes through an opening between the first member and the second member.

According to further aspects of the present disclosure, the second member is attached to the first member using a mechanical interlock.

According to further aspects of the present disclosure, adhering the enclosure to the transparent pane occurs prior to filling at least the portion of the enclosure with the sealing material.

According to further aspects of the present disclosure, a window assembly includes a transparent pane, an electrical conductor, an electrical-connection assembly, an electrical joint, and a mechanically protective enclosure adhered to the transparent pane, and a sealing material. The transparent pane includes glass. The electrical conductor is disposed on the transparent pane. The electrical-connection assembly is for energizing the electrical conductor. The electrical-connection assembly also having a wiring harness extending therefrom. The electrical joint between the electrical-connection assembly and the electrical conductor. The mechanically protective enclosure is adhered to the transparent pane to define an internal volume therebetween. The electrical joint is disposed within the internal volume and spaced from the enclosure, the enclosure defining an opening with the wiring harness extending therethrough. The sealing material is disposed within the internal volume to provide a fluidic barrier about the electrical joint.

According to further aspects of the present disclosure, the sealing material covers the electrical joint, and the sealing material contacts at least one wall of the enclosure to inhibit ingress of liquid into the internal volume.

According to further aspects of the present disclosure, the enclosure further includes at least one fill port configured to receive the sealing material therethrough.

According to further aspects of the present disclosure, the opening is disposed distal to the at least one fill port. The opening is configured to allow air to escape the internal volume as the sealing material is received through the at least one fill port, the sealing material configured to occupy the opening and the at least one fill port thereby inhibiting ingress of water into the internal volume.

According to further aspects of the present disclosure, the enclosure is an enclosure assembly including a first member adhered to the transparent pane and a second member mechanically attached to the first member.

According to further aspects of the present disclosure an enclosure environmentally sealing an electrical joint disposed on a glass pane. The enclosure includes a top member, a plurality of walls, and a sealing material. The plurality of walls extends from the top member and defines an open cavity therein. The plurality of walls defines a surface opposite the top member. The surface is configured to be adhered to the glass pane. At least one of the plurality of walls defining an opening therethrough. The opening is configured to receive a wiring harness therethrough. The sealing material is disposed within the open cavity. The sealing material is configured to deform about an electrical connection element received therein to provide a fluidic barrier about an electrical joint.

According to further aspects of the present disclosure, the enclosure further includes a vent disposed in the top member. The vent is configured to receive a displaced amount of the sealing material therethrough.

According to further aspects of the present disclosure, the enclosure further includes a first member and a second member. The first member includes the top member and a portion of the plurality of walls. The first member includes the sealing material. The second member includes a second portion of the plurality of walls. The second member is configured to be coupled to the first member through a mechanical interlock the second member.

The above features and advantages and other features and advantages of the present disclosure are readily apparent from the following detailed description when taken in connection with the accompanying drawings.

BRIEF DESCRIPTION OF THE DRAWINGS

The drawings are illustrative and not intended to limit the subject matter defined by the claims. Exemplary embodiments are discussed in the following detailed description and shown in the accompanying drawings in which:

DETAILED DESCRIPTION

Systems and methods in accord with the present disclosure provide for a fluidically sealed enclosure. The enclosure substantially reduces mechanical stress imparted on the electrical joint, and the fluidic seal reduces or eliminates water-catalyzed corrosion of the electrical joint.

Figure 1:
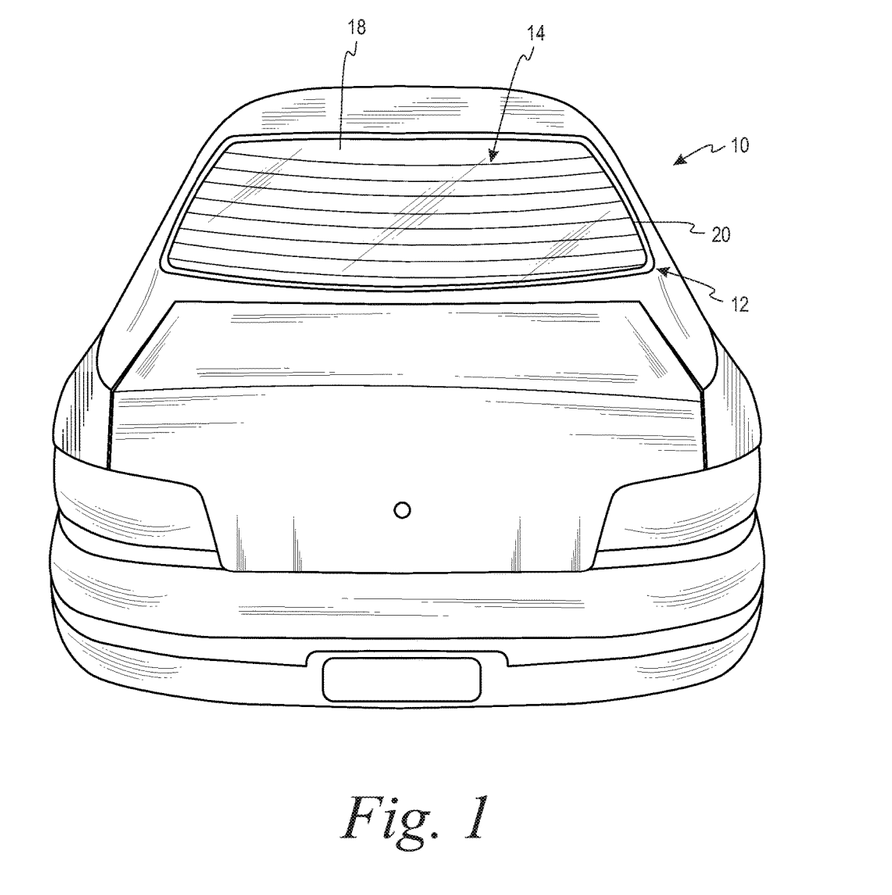
FIG. 1 is a schematic elevational view of a vehicle including a window assembly, according to embodiments of the present disclosure.
Figure 2:
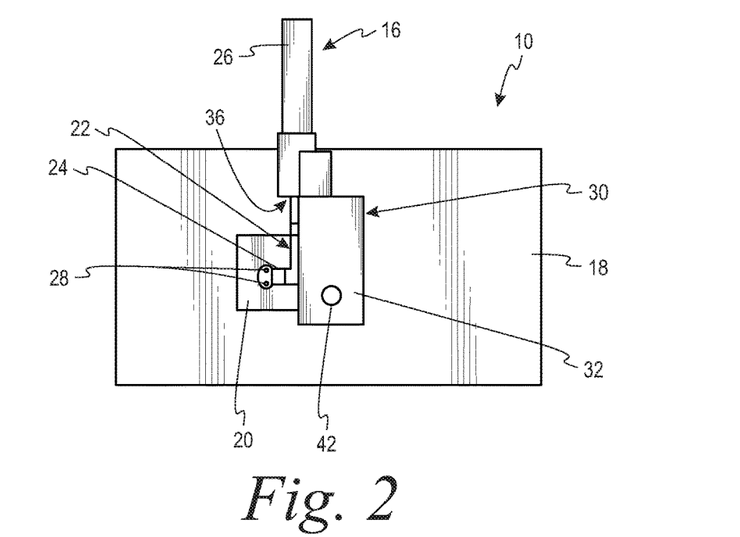
FIG. 2 is a schematic planar top view of a portion of the window assembly of FIG. 1 shown in partial cross-section.

Referring to FIGS. 1 and 2, a window assembly 12 is shown according to embodiments of the present disclosure. The window assembly 12 may be, for example, a rear window assembly of a vehicle 10 having a defrost system 14. The window assembly 12 includes a wiring harness 16, a transparent pane 18, an electrical conductor 20 attached to the transparent pane 18, and a physical enclosure 30 surrounding a portion of the electrical conductor 20. In some embodiments, the transparent pane 18 is made entirely of glass. In some embodiments, the transparent pane 18 may be a laminate including one or more layers of glass, polymethyl methacrylate, polycarbonate, polyvinyl butyral, polyethylene terephthalate, combinations thereof, and the like.

The electrical conductor 20 is in electrical communication with one or more working elements that are configured to perform or facilitate a desired function. In the illustrated figures, the working element may include one or more resistive heating elements that are part of the defrost system 14 and are operative to defrost or defog the transparent pane 18 by heating the transparent pane. It is contemplated that the electrical conductor 20 may likewise provide a different desired function requiring electrical connections, such as functioning as an antenna.

In some embodiments, the electrical conductor 20 is made from one or more layers of silver. In other embodiments, the electrical conductor 20 is made from one or more layers of other conductive metals and/or other conductive materials in addition to, or instead of, silver. The electrical conductor 20 may be a film, a coating, and/or any other suitable form. The electrical conductor 20 may be porous, nonporous, or a combination thereof. In some embodiments, the electrical conductor 20 is a porous silver film.

The electrical conductor 20 may be attached to the transparent pane 18 using, for example, fusion, adhesion, physical entrapment, combinations thereof, and the like. In some embodiments, the electrical conductor 20 may be printed onto the transparent pane 18 to produce, for example, a printed silver film or printed silver circuit. In some embodiments, the electrical conductor 20 is disposed on the transparent pane 18 near a peripheral edge of the transparent pane 18. The electrical conductor 20 is often a component of a circuit, such as the defrost system 14, an antenna, a defogger, or the like. The electrical conductor 20 may be integral with the circuit or an extension of the circuit. The electrical conductor 20 may include one or more bus bars (not shown). While the illustrated electrical conductor 20 defines a rectangular shape, the electrical conductor 20 may have any suitable shape.

The wiring harness 16 is configured to transfer an electric current between the electrical conductor 20 and an external device. In some embodiments, the external device is a power supply and the wiring harness 16 transfers power from the power supply (not shown) to the electrical conductor 20. The wiring harness 16 includes an electrical connection element 22 with a terminal connector 24 and a wire 26 extending therefrom. The terminal connector 24 is disposed at a distal end of the wiring harness 16 and is configured to mechanically engage the electrical conductor 20 attached to the transparent pane 18.

The electrical connection element 22 electrically couples the electrical conductor 20 to the wire 26. The electrical connection element 22 is in electrical communication with the electrical conductor 20 for energizing the electrical conductor 20. The electrical connection element 22 can be formed from copper, copper alloys, silver, silver alloys, combinations thereof, and the like. The electrical connection element 22 may also include iron, molybdenum, tungsten, nickel, hafnium, tantalum, titanium, chromium, iridium, niobium, vanadium, platinum, tin, combinations thereof, and the like in addition to or in place of the copper, copper alloys, silver, and silver alloys. In the illustrated embodiment, the electrical connection element 22 is copper.

In some embodiments, the electrical connection element 22 is both mechanically and electrically coupled with the electrical conductor 20, for example, via an electrical joint 28 that is formed between and/or on an external surface of the electrical conductor 20 and the terminal connector 24 using conductive adhesives, films, rubbers, or springs. In some embodiments, the electrical joint 28 is a solder joint made from metals and/or alloys formed from lead, indium, tin, copper, silver, bismuth, germanium, gallium, gold, and/or other conductive metals and non-metals. In some embodiments, the electrical joint 28 is formed from a lead-free solder.

Figure 3:
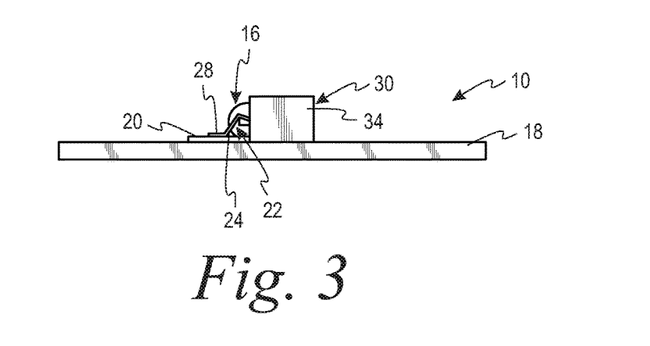
FIG. 3 is a schematic front elevational view of the portion of the window assembly of FIG. 1 shown in partial cross-section.
Figure 4:
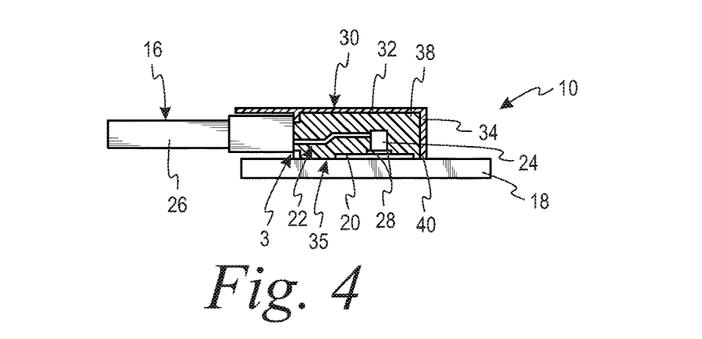
FIG. 4 is a schematic side elevational view of the portion of the window assembly of FIG. 1 shown in partial cross-section.

To protect the electrical joint 28 from physical stresses or impacts that may compromise the strength or durability of the mechanical/electrical connection, a physical enclosure 30 may be affixed to the transparent pane 18 in a surrounding arrangement about the electrical joint 28. FIGS. 2-4 illustrate the enclosure 30 in partial cross-section. As shown, the enclosure 30 provides a physical barrier surrounding the electrical joint 28 and precludes contact between the electrical joint 28 and components external the enclosure 30. The enclosure 30 can be any geometric shape so long as the geometric shape is sufficient to surround the electrical joint 28, thereby providing a physical barrier. Beneficially, the enclosure 30 also inhibits corrosion of the portion of the electrical conductor 20 disposed therein.

In some embodiments, such as illustrated in the figures, the enclosure 30 may have a top member 32 and a plurality of walls 34 extending downwardly from the top member 32 to engage the transparent pane 18. The top member 32 and the plurality of walls 34 define an open cavity. When engaged with the transparent pane 18, the top member 32, the plurality of walls 34, and the transparent pane 18 define an internal volume 35. Moreover, at least one of the plurality of walls 34 defines an opening 36 that is configured to receive a portion of the wiring harness 16. In some embodiments, the opening 36 may include one or more strain relief features to prevent physical manipulation of the wire 26 from stressing the electrical joint 28.

The enclosure 30 may be formed from a polymeric material including thermoplastic polymers, thermoset polymers, combinations thereof, and the like. Non-limiting examples of the polymeric material include silicones, nylons, polybutylene terephthalate, polyvinyl chloride, polyethylene terephthalate, polycarbonate, polyoxymethylene, and the like. In one configuration, the enclosure 30 may be attached to the transparent pane 18 using an adhesive 40. The adhesive 40 may attach the enclosure 30 to the electrical conductor 20 in addition to or as an alternative to attachment to the transparent pane 18. Suitable adhesives are adhesives that provide adhesion to glass, such as pressure sensitive adhesives, structural bonding tape, urethanes, epoxies, acrylics, silicones, and the like. Optionally, an adhesion promoter or primer can be placed on the transparent pane 18 to improve bonding of the adhesive 40.

While the physical enclosure 30 may provide an effective barrier against physical contact with the electrical joint 28, it may prove less effective at protecting the electrical joint 28 from being contacted by liquids that may chemically degrade the joint 28 through corrosion. More specifically, openings, such as the opening 36 for the wire 26, or imperfect sealing to the transparent pane 18 may permit the ingress of water or other liquids that may be difficult to later evacuate from the enclosure 30. These entrapped liquids may then create a micro environment that can lead to the degradation of the electrical joint 28, which can present durability issues. To improve the environmental barrier qualities of the enclosure 30, a fluidic sealing material 38 may be provided within the enclosure 30 to fill at least a portion of the internal volume and further isolate the electrical joint 28.

As generally illustrated in FIG. 4, the sealing material 38 preferably encapsulates the terminal connector 24 and at least a portion of the electrical conductor 20 to prevent corrosion of the electrical joint 28. In some embodiments, the sealing material inhibits ingress of water into the enclosure 30, for example, by sealing between the opening 36 and the wiring harness 16 passing therethrough. Depending on the application and specific arrangement of components, the sealing material 38 may either be an electrically conductive material or an electrically insulating material. In some embodiments, the electrically insulating material is selected from the group consisting of silicone, room-temperature vulcanization silicone, flexibilized epoxies, urethane, butyl, dielectric grease, and combinations thereof.

It is desirable that the fluidic sealing material 38 have sufficient viscosity to prevent the material 38 from leaking out of the enclosure 30 after assembly, though sufficient fluidity to resist imparting stresses from the enclosure 30 or thermal expansion to the electrical joint 28. In some embodiments, the sealing material 38 may be a curable material that is flexible after curing. In some embodiments, the sealing material 38 is a viscous fluid, such as a dielectric grease, that substantially maintains its placement over time.

In some embodiments, the sealing material 38 may be applied prior to attaching the enclosure 30 to the transparent pane 18. For example, the sealing material 38 may be placed within the open cavity formed by the top member 32 and the plurality of walls 34. The sealing material 38 is configured to generally deform to cover the electrical connection element 22 concurrent with attachment of the enclosure to the transparent pane 18.

In some embodiments, the sealing material 38 may be applied after the enclosure 30 is attached to the transparent pane 18. For example, the sealing material 38 may be injected into the enclosure 30 via a needle and/or may be provided into the volume 35 through an opening (e.g., opening 36) or through an ancillary fill port 42. In one configuration, if a needle is used, the needle may penetrate a solid portion of the enclosure 30. After removal of the needle, the enclosure 30 substantially closes the puncture to prevent ingress of water therethrough. Alternatively, the sealing material 38 may be injected through the opening 36 of the enclosure 30 through which the wiring harness 16 passes. In still other embodiments, the enclosure 30 may include at least one fill port 42 (e.g., as shown in FIG. 2). The fill port 42 is configured to receive an injection of the sealing material 38 using, for example, a nozzle or other fill device.

During the fill process, the opening 36 and/or fill port 42 may beneficially provide a vent for air to escape when being displaced by the sealing material 38. Additionally, in some embodiments, the opening 36 may also provide a visual indication of when the internal volume is sufficiently filled by the sealing material 38. For example, an operator/assembler may determine that the internal volume has, in fact, been filled by examining whether the sealing material 38 is disposed within, or visible through the opening 36 or fill port 42. Likewise, when the sealing material exits the opening 36, the sealing material 38 will form a substantially fluid-tight seal between the plurality of walls 34 and the portion of the wiring harness 16 passing through the opening 36.

In some embodiments, the enclosure 30 includes one or more vents (not shown) in addition to the opening 36. The vents are configured to provide for air to escape the internal volume 35 when being displaced by the sealing material 38. Beneficially, the vents may be disposed relative to the fill port 42 to ensure the sealing material 38 occupies desired portions of the internal volume 35. For example, vents can be disposed distal the opening 36 to inhibit trapping of air within the internal volume and to provide a visual indicator that the internal volume 35 is substantially filled with the sealing material 38.

In some embodiments, the internal volume 35 may include a second electrical connection element therein. In some embodiments, the second electrical connection element may be attached to a second wire extending outside the internal volume 35. In this dual-connection configuration, the sealing material 38 may additionally cover a second electrical joint between the second electrical connection element and a second electrical conductor disposed on the transparent pane 18.

In some embodiments, the transparent pane 18 further includes a ceramic coating thereon. In some embodiments, the enclosure 30 is adhered to the ceramic coating. Optionally, the adhesion promoter or primer can be placed between the ceramic coating and adhesive 40 to improve bonding with the enclosure 30.

Figure 5:
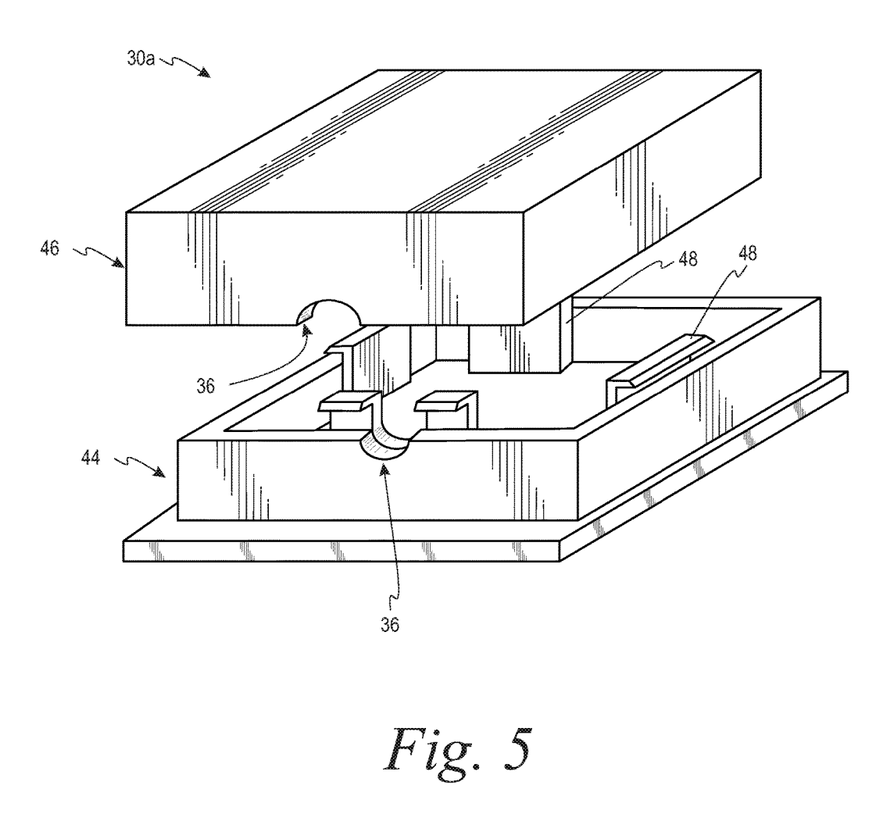
FIG. 5 is a schematic elevational view of an enclosure assembly, according to embodiments of the present disclosure.

FIG. 5 illustrates a multi-part enclosure assembly 30a that may be used in a similar manner as the enclosure 30 illustrated in FIGS. 2-4. As shown, the enclosure assembly 30a includes a first member 44 and a second member 46. The first member 44 is adhered to the transparent pane and the second member 46 is attached to the first member 44. In some embodiments, the first member 44 is attached to the second member 46 via a mechanical interlock 48. The opening 36 for the wiring harness 16 may be defined between the first member 44 and the second member 46 when the second member 46 is attached to the first member 44. Use of a multi-part enclosure assembly may enable the use of pre-filled enclosures 30 without the concern of overfill compromising the bond between the enclosure 30 and the transparent pane 18. More specifically, the first member 44 can be adhered to the transparent pane 18 prior to attachment of the pre-filled second member 46. Because the first member 44 is secured to the transparent pane prior to attaching the second member 46, any overfill and squeeze-out of sealing material 38 pre-filled within the enclosure assembly 30a will exit only through the opening and will not interfere with the adhesive interface between the first member 44 and the transparent pane 18.

Figure 6:
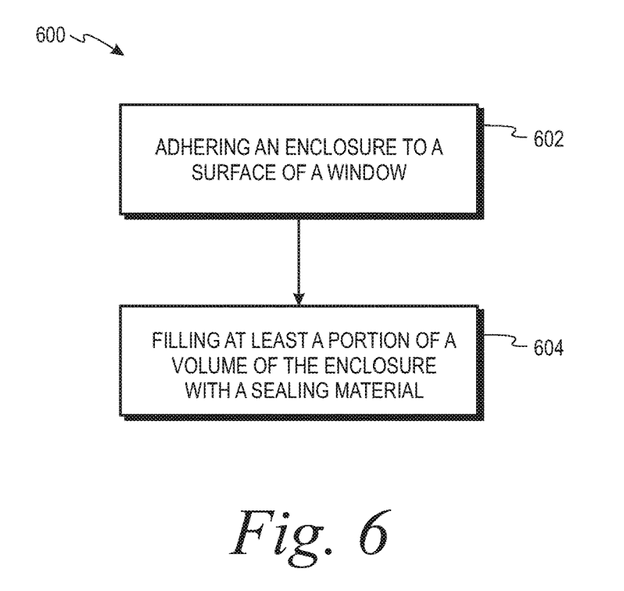
FIG. 6 is a schematic flowchart of a method of producing fluidically sealed enclosures for window electrical connections, according to embodiments of the present disclosure.
Figure 7:
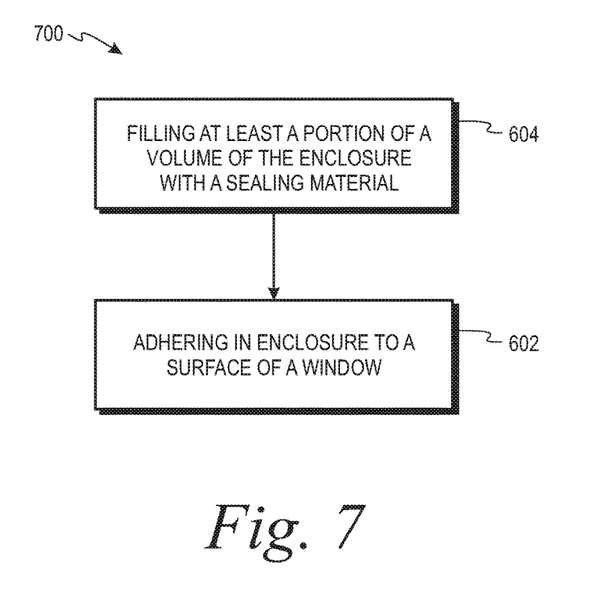
FIG. 7 is a schematic flowchart of another method of producing fluidically sealed enclosures for window electrical connections, according to embodiments of the present disclosure.

Referring now to FIGS. 6 and 7, methods of providing a window assembly 12 with a fluidically sealed enclosure are shown. The methods of FIGS. 6 and 7 each include adhering 602 an enclosure to a transparent pane 18 and filling 604 at least a portion of an internal volume of the enclosure with a sealing material.

FIG. 6 illustrates a method 600 of providing a window assembly 12 having a fluidically sealed enclosure wherein adhering 602 the enclosure to the transparent pane occurs prior to filling 604 at least the portion of the internal volume of the enclosure. FIG. 7 illustrates a method 700 of providing a window assembly 12 having a fluidically sealed enclosure wherein adhering 602 the enclosure to the transparent pane occurs after filling 604 at least the portion of the internal volume of the enclosure.

After adhering 602 the enclosure to the transparent pane, an internal volume is defined by the enclosure and the transparent pane and an electrical connection element 22 is disposed within the internal volume. The electrical connection element 22 is attached to a wire 26 extending outside of the internal volume.

The sealing material, after both adhering 602 the enclosure to the transparent pane and filling 604 at least the portion of the internal volume, covers an electrical joint 28 between the electrical connection element 22 and an electrical conductor disposed on the transparent pane. The sealing material, after both adhering 602 the enclosure to the transparent pane and filling 604 at least the portion of the internal volume, also contacts at least one wall of the enclosure.

Beneficially, systems and methods as described herein allow for direct mechanical contact between the enclosure 30 and components external to the window assembly 12 with little or no stress transferred to the electrical joints 28 or little or no fatigue of the electrical joints 28.

In further embodiments and/or uses of the present technology, the window assembly 12 may include one or more functional components (not shown) for aligning, positioning, or guiding the window assembly 12 on the vehicle 10. In some embodiments, the functional component may be a rail for allowing the window assembly 12 to slide on a complementary rail attached to the vehicle 10. In some embodiments, the functional component is a frame for mounting the window assembly 12 to the vehicle 10. The functional components may be attached to the window assembly 12 via a polymeric encapsulation that encapsulates a portion of the functional component. In these configurations, the functional component may define the first member 44 of the multi-part enclosure 30a.

While the above-described window assemblies 10 have been illustrated with respect to vehicular applications, the systems and methods disclosed herein may be used in other applications where an unprotected electrical connection element 22 would be exposed to the elements, such as buildings, and where transfer of direct mechanical stresses to the electrical connection element 22 pose a recognized risk of breaking the electrical joint 28.

EXAMPLES

Example 1

A sample is prepared without a mechanically protective enclosure or sealing material around an electrical joint. The sample includes a transparent pane of glass and an electrical conductor consisting essentially of silver. The electrical joint is formed on the electrical conductor. The sample is exposed to water having a 5% concentration of salt at 38° C. for 96 hours. Following the exposure, mild delamination of the electrical conductor from the glass is observed, with corrosion present on the electrical conductor proximate to the delamination site.

Example 2

A sample is prepared without a mechanically protective enclosure or sealing material around an electrical joint. The sample includes a transparent pane of glass and an electrical conductor consisting essentially of silver. The electrical joint is formed on the electrical conductor. The sample is exposed to water at 50° C. for 720 hours. Following the exposure, significant delamination and peel of the electrical conductor from the glass is observed, with corrosion present on the electrical conductor proximate to the delamination site.

Example 3

A window assembly is prepared with a mechanically protective enclosure around an electrical joint. No sealing material is disposed within the internal volume of the enclosure. The window assembly includes a transparent pane of glass and an electrical conductor consisting essentially of silver. The electrical joint is formed on the electrical conductor. The window assembly is exposed to field conditions for between 12 and 18 months. Following the exposure, corrosion is observed on the electrical conductor only at the contact area between the electrical conductor and the electrical joint. The corrosion covered more than 30% of the contact area.

Example 4

A sample is prepared with a mechanically protective enclosure around an electrical joint. A portion of the internal volume of the mechanically protective enclosure is filled with a sealing material such that the sealing material inhibits ingress of liquid into the volume. The sample includes a transparent pane of glass and an electrical conductor consisting essentially of silver. The electrical joint is formed on the electrical conductor. The sample is exposed to water having a 5% concentration of salt for 1200 hours. Following the exposure, no delamination of the electrical conductor is observed, and no corrosion is observed around the electrical joint.

While the best modes for carrying out the disclosure have been described in detail, those familiar with the art to which this disclosure relates will recognize various alternative designs and embodiments for practicing the disclosure within the scope of the appended claims.

What is claimed is:

1. A method of environmentally sealing an electrical joint formed between an electrical connection element and an electrical conductor disposed on a transparent pane, the method comprising:
    adhering a mechanically protective enclosure to the transparent pane to define an internal volume therebetween, wherein the electrical joint is disposed within the internal volume and spaced from the enclosure; and
    filling at least a portion of the internal volume with a sealing material that inhibits ingress of liquid into the internal volume and provides a fluidic environmental barrier about the electrical joint,
    wherein the sealing material, after filling, covers the electrical joint, and
    wherein the sealing material, after filling, contacts at least one wall of the enclosure.

2. The method of claim 1, wherein filling includes injecting the sealing material into the internal volume via a fill port extending through the enclosure.

3. The method of claim 2, further comprising determining that the filling has been performed by identifying a presence of the sealing material within the fill port.

4. The method of claim 1, wherein the transparent pane further includes a ceramic coating disposed thereon, and wherein the electrical conductor is adhered to the ceramic coating.

5. The method of claim 1, wherein the electrical conductor consists essentially of silver.

6. The method of claim 1, wherein the sealing material is an electrically insulating material.

7. The method of claim 1, wherein the internal volume includes a second electrical connection element therein, the second electrical connection element being attached to a second wire extending outside the internal volume, and wherein the sealing material, after filling, covers a second electrical joint between the second electrical connection element and a second electrical conductor disposed on the transparent pane.

8. The method of claim 1, wherein the enclosure is adhered to the transparent pane using structural bonding tape or a pressure-sensitive adhesive.

9. The method of claim 1, wherein the enclosure includes a first member and a second member, wherein the first member is adhered to the transparent pane, wherein the second member is attached to the first member, wherein a wiring harness passes through an opening between the first member and the second member.

10. The method of claim 9, wherein the second member is attached to the first member using a mechanical interlock.

11. The method of claim 1, wherein adhering the enclosure to the transparent pane occurs prior to filling at least the portion of the enclosure with the sealing material.

12. A window assembly comprising:
    a transparent pane including glass;
    an electrical conductor disposed on the transparent pane;
    an electrical-connection assembly for energizing the electrical conductor, the electrical-connection assembly having a wiring harness extending therefrom;
    an electrical joint between the electrical-connection assembly and the electrical conductor;
    a mechanically protective enclosure adhered to the transparent pane to define an internal volume therebetween, wherein the electrical joint is disposed within the internal volume and spaced from the enclosure, the enclosure defining an opening with the wiring harness extending therethrough; and a sealing material disposed within the internal volume to provide a fluidic barrier about the electrical joint,
wherein the sealing material covers the electrical joint, and
wherein the sealing material contacts at least one wall of the enclosure to inhibit ingress of liquid into the internal volume.

13. The window assembly of claim 12, wherein the enclosure further includes at least one fill port configured to receive the sealing material therethrough.

14. The window assembly of claim 13, wherein the opening is disposed distal to the at least one fill port, the opening configured to allow air to escape the internal volume as the sealing material is received through the at least one fill port, the sealing material configured to occupy the opening and the at least one fill port thereby inhibiting ingress of water into the internal volume.

15. The window assembly of claim 12, wherein the enclosure is an enclosure assembly including a first member adhered to the transparent pane and a second member mechanically attached to the first member, wherein the transparent pane further includes a ceramic coating disposed thereon, wherein the electrical conductor is adhered to the ceramic coating, wherein the electrical conductor consists essentially of silver, wherein the internal volume includes a second electrical connection element therein, the second electrical connection element being attached to a second wire extending outside the internal volume, wherein the sealing material, after filling, covers a second electrical joint between the second electrical connection element and a second electrical conductor disposed on the transparent pane, and wherein the enclosure is adhered to the transparent pane using structural bonding tape or a pressure-sensitive adhesive.

16. An enclosure for environmentally sealing an electrical joint disposed on a glass pane, the enclosure comprising:
a top member;
a plurality of walls extending from the top member and defining an open cavity therein, the plurality of walls defining a surface opposite the top member, the surface configured to be adhered to the glass pane, at least one of the plurality of walls defining an opening therethrough, the opening configured to receive a wiring harness therethrough; and
a sealing material within the open cavity, the sealing material contacting the at least one of the plurality of walls or another at least one of the plurality of walls, the sealing material configured to deform about an electrical connection element received therein to provide a fluidic barrier about the electrical joint, the sealing material configured to cover the electrical joint.

17. The enclosure of claim 16, further comprising a vent disposed in the top member, the vent configured to receive a displaced amount of the sealing material therethrough.

18. The enclosure of claim 16, further comprising a first member and a second member, the first member including the top member and a portion of the plurality of walls, the first member including the sealing material, the second member including a second portion of the plurality of walls, the second member configured to be coupled to the first member through a mechanical interlock the second member, wherein the transparent pane further includes a ceramic coating disposed thereon, wherein the electrical conductor is adhered to the ceramic coating, wherein the electrical conductor consists essentially of silver, wherein the internal volume includes a second electrical connection element therein, the second electrical connection element being attached to a second wire extending outside the internal volume, wherein the sealing material, after filling, covers a second electrical joint between the second electrical connection element and a second electrical conductor disposed on the transparent pane, and wherein the enclosure is adhered to the transparent pane using structural bonding tape or a pressure-sensitive adhesive.

\* \* \* \* \*